United States Patent
Nakahara et al.

(10) Patent No.: US 6,550,135 B2
(45) Date of Patent: Apr. 22, 2003

(54) METHOD OF PART MOUNTING

(75) Inventors: Kazuhiko Nakahara, Fukuoka (JP); Hideki Sumi, Fukuoka (JP); Takahiro Noda, Fukuoka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 152 days.

(21) Appl. No.: 09/793,458

(22) Filed: Feb. 26, 2001

(65) Prior Publication Data

US 2001/0032030 A1 Oct. 18, 2001

(30) Foreign Application Priority Data

Feb. 24, 2000 (JP) .......................... 2000-046923

(51) Int. Cl.[7] .................. H05K 3/30; G06K 9/03
(52) U.S. Cl. ................ 29/833; 29/832; 29/702; 29/720; 29/740; 700/58; 700/121; 348/87; 382/151
(58) Field of Search .............. 29/407.1, 701, 29/702, 720, 740, 833, 834, 836, 832; 700/58, 59, 121, 194, 259; 348/87; 382/151

(56) References Cited

U.S. PATENT DOCUMENTS 4,951,240 A * 8/1990 Fukino
6,216,341 B1 * 4/2001 Nakahara

FOREIGN PATENT DOCUMENTS

| EP | 1213951 | * | 6/2002 |
| JP | 05-267899 | * | 10/1993 |
| JP | 08-102599 | * | 4/1996 |
| JP | 10-284892 | * | 10/1998 |
| JP | 11-346098 | * | 12/1999 |
| JP | 2000-31695 | * | 1/2000 |
| JP | 2002-26595 | * | 1/2002 |

* cited by examiner

Primary Examiner—Gregory Vidovich
Assistant Examiner—Eric Compton
(74) Attorney, Agent, or Firm—RatnerPrestia

(57) ABSTRACT

When plural board blocks formed in one board undergo sequential part-mountings at plural mounting stages, particular recognition points and recognition points in the board blocks target of a downstream mounting stage are recognized at an upstream mounting stage. Relative positional data of each recognition point of the board block with respect to the particular recognition points are thus obtained at the upstream mounting stage. At the mounting stage on downstream side, only the particular recognition points are recognized thereby detecting a whole position of the board. Based on the whole position and the relative positional data, a positional deviation of the board block at the mounting stage can be detected, so that repeated recognition of the same recognition points is avoided thereby shortening a total time of position recognition.

8 Claims, 7 Drawing Sheets

METHOD OF PART MOUNTING

FIELD OF THE INVENTION

The present invention relates to a method of mounting, e.g., electronic parts onto a board.

BACKGROUND OF THE INVENTION

When electronic parts are mounted on a board, a mounting position is corrected based on a position detection resulting from an optical method in order to obtain a certain accuracy of the mounting position. For this purpose, recognition marks are put on the board for recognizing the position of the board. At a mounting stage, recognizing this recognition mark sometimes produces a positional deviation, which is corrected during transporting the part by a transfer-head before an actual mounting.

There are various types of boards. One of them is a multiple printed board, i.e., multiple board blocks (unit boards) are formed in one single board. This multiple printed board is handled as a single board in a manufacturing process including mounting stages, then after the parts are completely mounted, the single board is divided into a plurality of printed wired assemblies. In this multiple printed board, relative positional accuracy of respective blocks with each other within the single board is not always obtained. Therefore, the recognition marks are provided in each block. The marks are recognized for mounting the parts.

In a conventional case, when the board undergoes plurality of mounting stages, and parts are sequentially mounted on the board, the recognition marks of each block are taken a shot by a camera at each stage. Therefore, the same marks are recognized many times, which makes a total recognition time long. As a result, it has been an obstacle to the improvement of mounting efficiency.

SUMMARY OF THE INVENTION

The present invention addresses the problem discussed above, and aims to provide a part-mounting method which can shorten a board-position-recognition-time, thereby improving the mounting efficiency.

A part-mounting-method of the present invention mounts sequentially parts onto a plurality of blocks (unit boards) formed on a single entire board at a plurality of mounting stages. The method comprises the following steps:

(a) at a first mounting stage, recognizing every recognition point formed on a single entire board, thereby obtaining relative positional data of each recognition point formed in the single entire board;

(b) at a second stage and onward, recognizing particular recognition points, thereby detecting a whole position of the single entire board with respect to respective stages;

(c) based on this whole position and the relative positional data, detecting a positional deviation of a board block at respective stages; and (d) correcting the positional deviation and mounting the parts onto the board block.

Another method of the present invention also mounts sequentially parts onto a plurality of blocks (unit boards) formed on a single entire board at a plurality of mounting stages. The method comprises the following steps:

(a) at a particular stage, recognizing the following three kinds of recognition points: (a-1) particular recognition points of a single entire board, (a-2) recognition points of a target board block of this particular stage and (a-3) recognition points of another target board block of downstream stage from this particular stage, thereby obtaining relative positional data of respective recognition points of the target board blocks with respect to the particular recognition points;

(b) at the downstream stage from the particular stage, recognizing the particular recognition points only, thereby detecting a whole position of the single entire board;

(c) based on the whole position and the relative positional data discussed above, detecting a positional deviation of the target board block at the downstream stage; and (d) correcting the positional deviation and mounting the parts onto the board block.

According to these methods, at the particular mounting stage in the upstream, particular recognition points of the single entire board and the recognition points of the target board blocks in the downstream are recognized. Thus the relative positional data of the respective recognition points in the target board blocks with respect to the particular recognition points are obtained. At the downstream mounting stage, therefore, only the particular recognition points are recognized for detecting the whole position of the single entire board. Based on the whole position and the relative positional data, a positional deviation of the target board block of an active mounting stage is detected. Then the positional deviation is corrected before the parts are mounted onto the target board block. As such, a disadvantage of the conventional method, i.e., a recognition points are repeatedly recognized, is overcome, and a total recognition time can be shortened.

DETAILED DESCRIPTION OF THE EXEMPLARY EMBODIMENTS

The exemplary embodiments of the present invention are demonstrated hereinafter with reference to the accompanying drawings.

First Exemplary Embodiment

Figure 1:
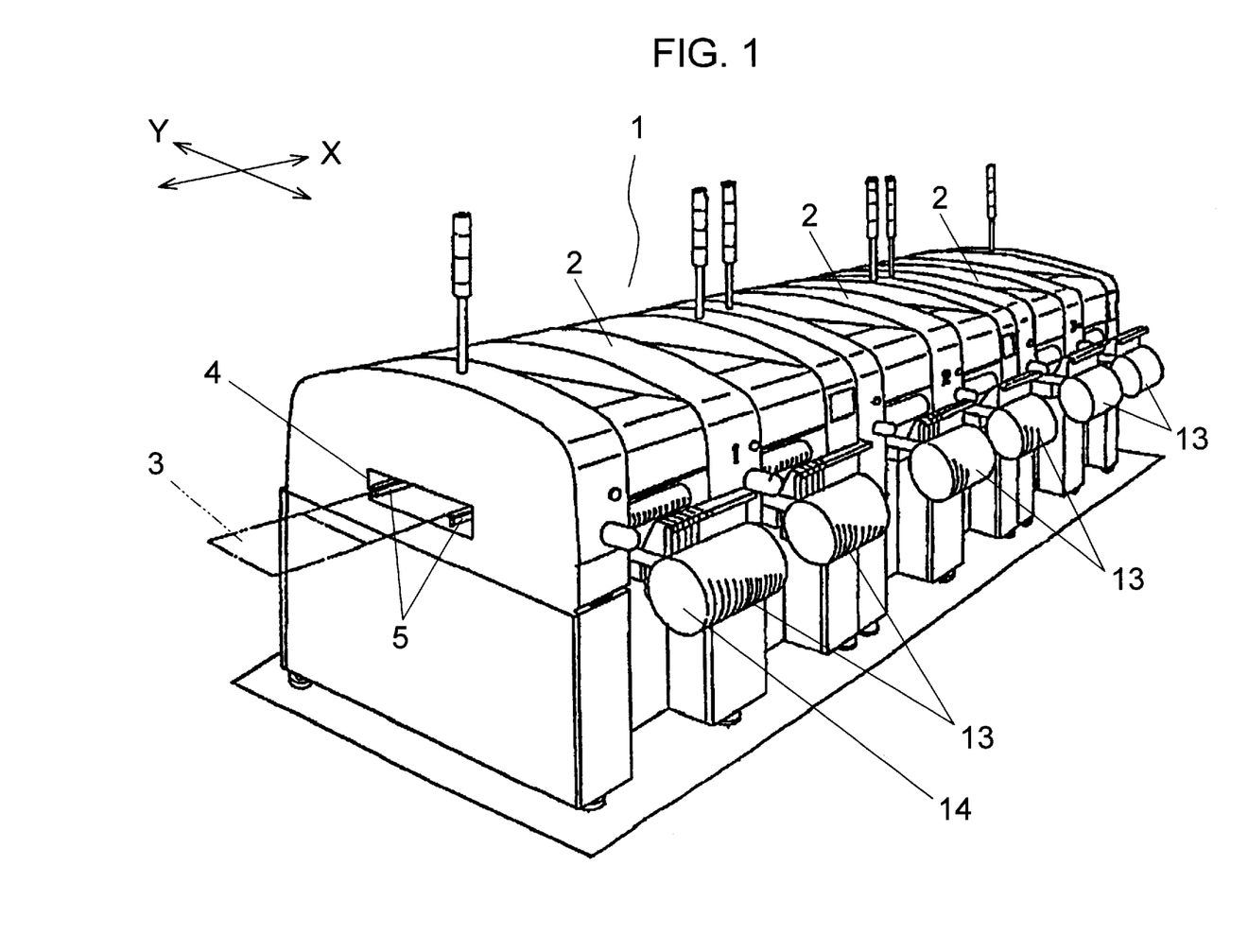
FIG. 1 is a perspective view of a part-mounting-equipment employing a part-mounting-method of the present invention.
Figure 2:
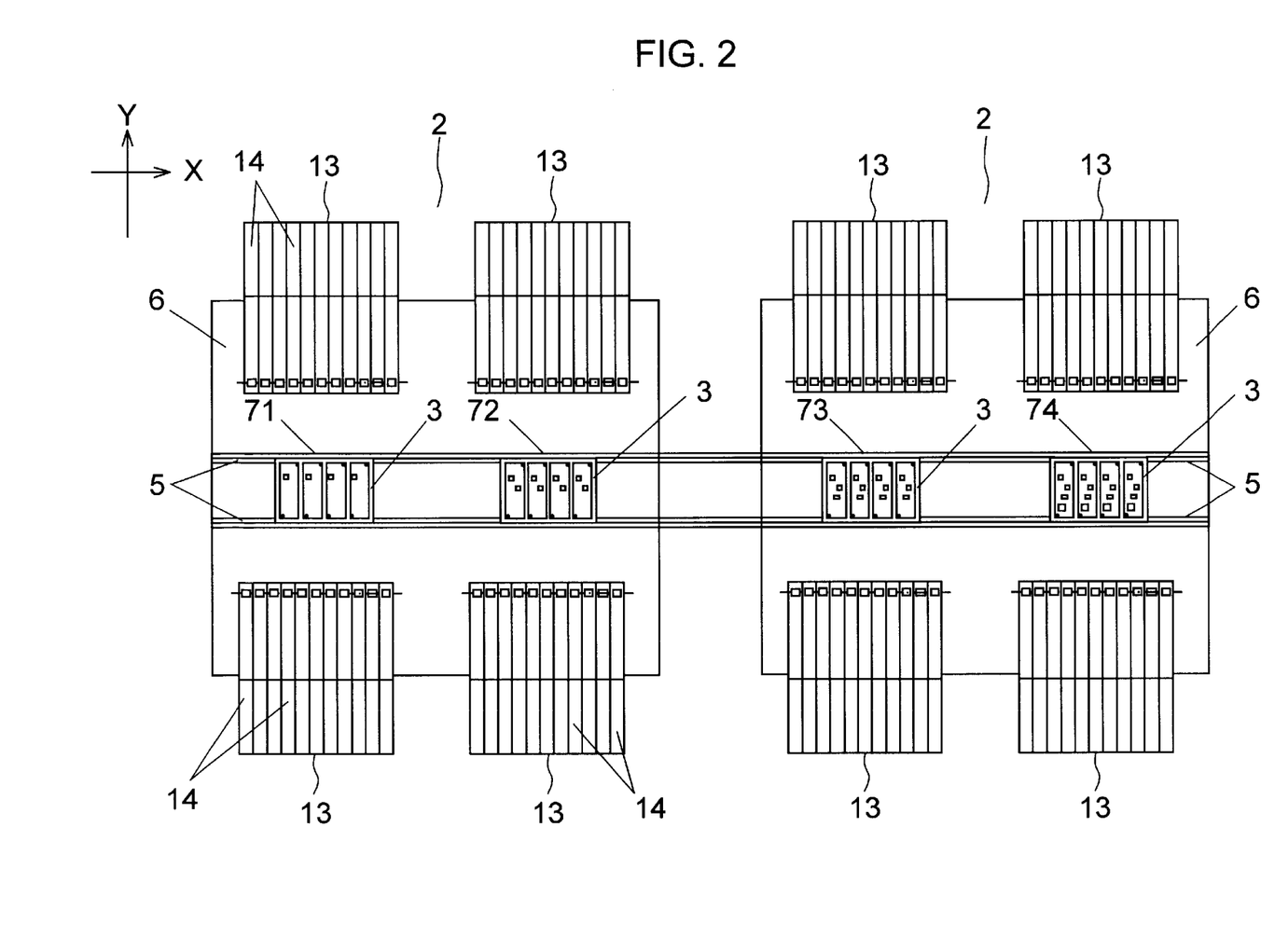
FIG. 2 is a plan view of the equipment shown in FIG. 1.
Figure 3:
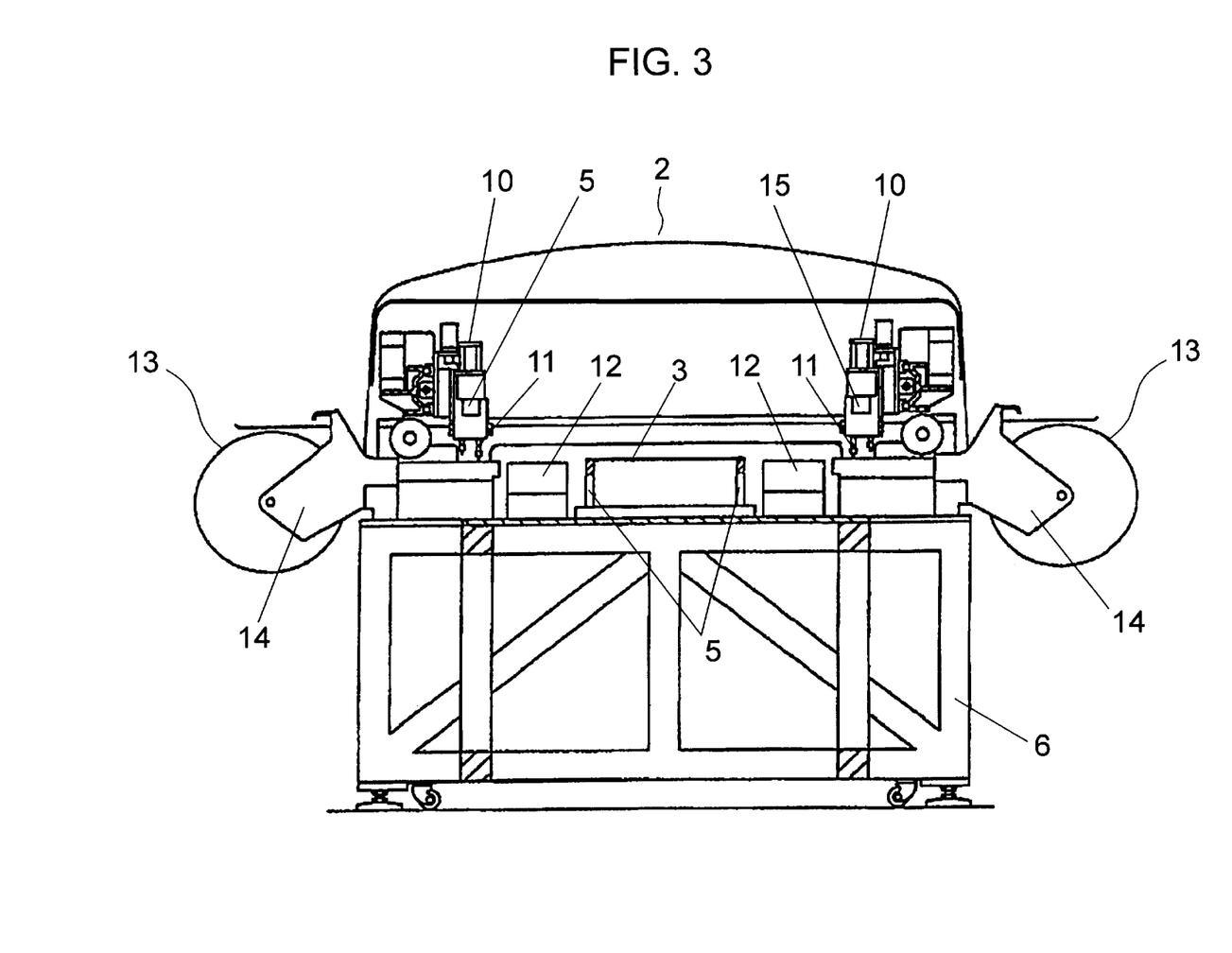
FIG. 3 is a cross section of the equipment shown in FIG. 1.
Figure 4:
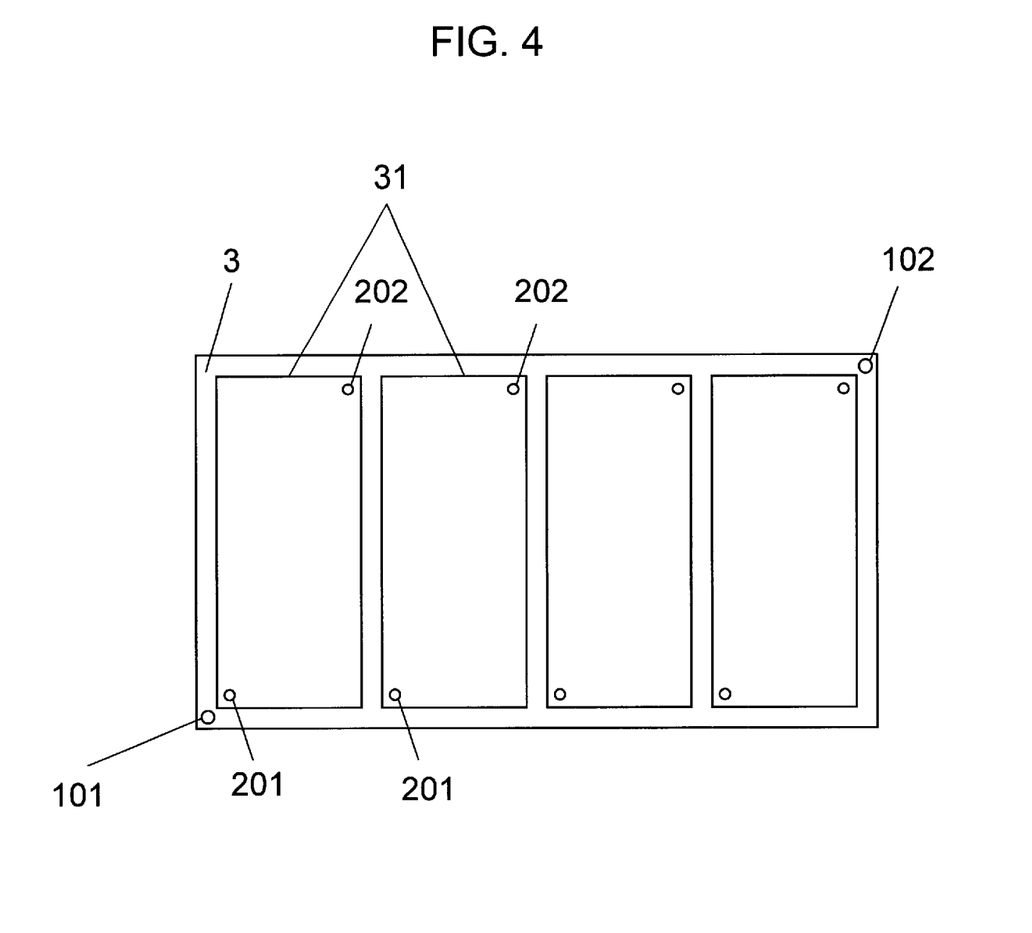
FIG. 4 is a plan view of a board used in the part-mounting-method of the present invention.
Figure 5:
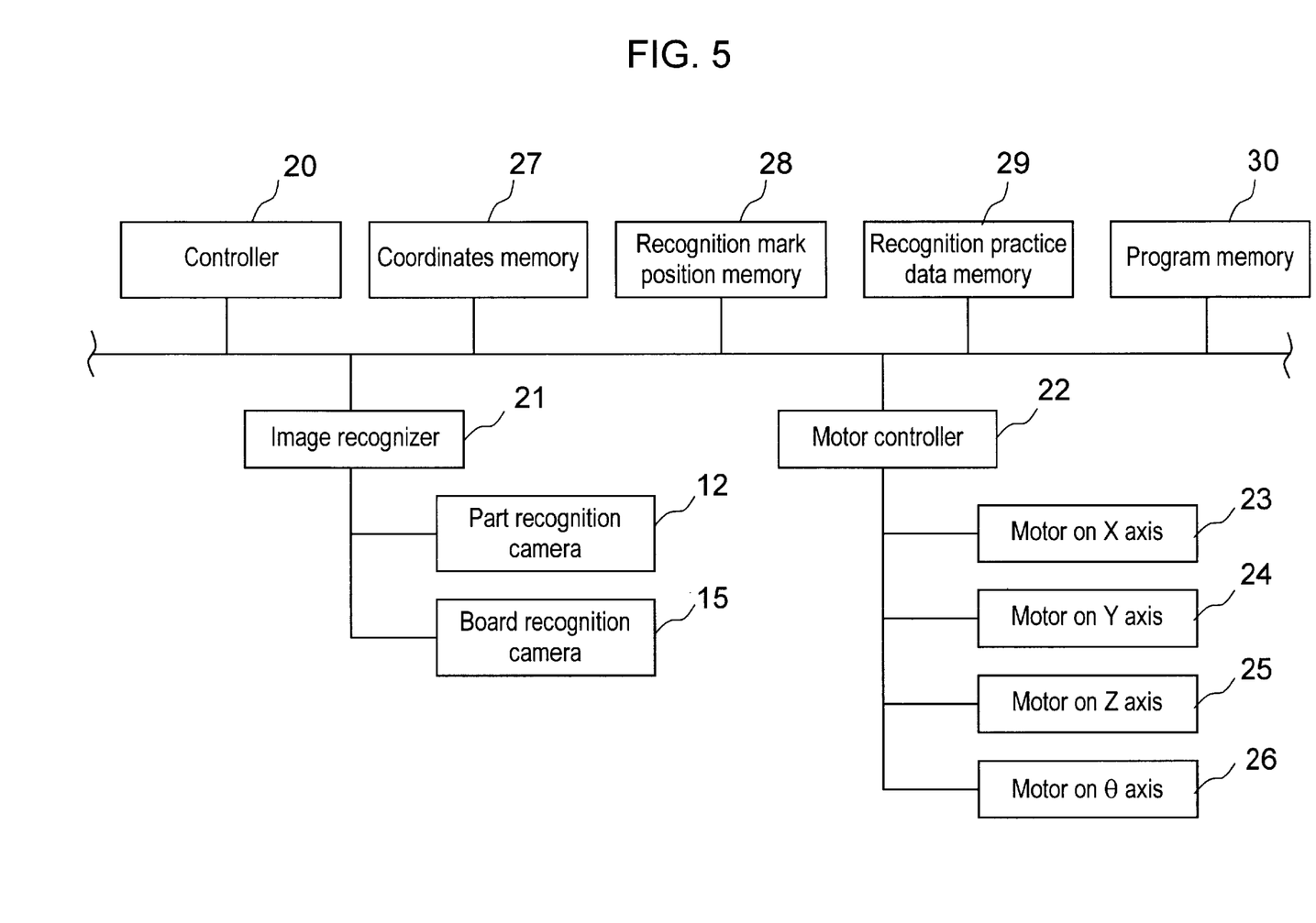
FIG. 5 is a block diagram illustrating a control system of the part-mounting-equipment employing the part-mounting-method of the present invention.

FIG. 1 is a perspective view of a part-mounting-equipment employing a part-mounting-method of the present invention. FIG. 2 is a plan view of the equipment shown in FIG. 1. FIG. 3 is a cross section of the same equipment. FIG. 4 is a plan view of a board used in the part-mounting-method of the present invention. FIG. 5 is a block diagram illustrating a control system of the part-mounting-equipment employing the part-mounting-method of the present invention. FIG. 6A–FIG. 6D illustrate processes of part-mounting-method in accordance with the first exemplary embodiment of the present invention.

First, an overall structure of the part-mounting-equipment is described with reference to FIG. 1–FIG. 3.

In FIG. 1, equipment 1 comprises three units of part-mounting-apparatus 2 lined up straight. The most upstream unit of apparatus 2 has inlet 4 for a board on its side face. Target board 3 is fed onto transport path 5 through inlet 4. As shown in FIG. 2, transport paths 5 disposed on base 6 of each unit apparatus 2 are linked to form one complete transport path. On both sides of transport path 5, four part-suppliers 13 per unit apparatus 2 are disposed symmetrically.

Each apparatus 2 has a pair of XY tables corresponding to respective part-suppliers 13. Every XY table has a transfer-head for picking up a part and mounting it onto a board. Two transfer-heads 10 are shown in a cross sectional view of FIG. 3. These heads 10 respectively include board-recognition-cameras 15. The XY table is driven and head 10 is moved, so that camera 15 recognizes board 3 on transport-path 5, and then a position of board 3 is detected.

Head 10 picks up a part with nozzle 11 from tape-feeder 14 disposed in part-supplier 13. Head 10 then travels above part-recognition-camera 12 disposed between supplier 13 and transport path 5, and recognizes the part. Finally, head 10 mounts the part onto board 3 positioned on path 5. In this procedure, board 3's deviation detected by camera 15 and part's deviation detected by camera 12 are corrected, then the part is mounted on board 3.

In other words, transport path 5 functions as a mounting stage where board 3 is halted and the part is mounted. Each apparatus 2 includes two mounting stages having two heads 10 respectively. At this mounting stage, two heads 10 disposed on both sides of path 5 mount the parts onto board 3. Entire part-mounting-equipment 1 has six mounting stages linked in series, and board 3 travels through these stages sequentially, thereby completing a given mounting job. FIG. 2 shows only four stages, 71, 72, 73 and 74 on the upstream side out of six stages.

Next, board 3 is described with reference to FIG. 4. As shown in FIG. 4, a plurality of board blocks 31 (unit boards) are formed in board 3. Each block 31 is the same type, and the same parts are mounted on the same spots of respective blocks. Board 3 is transported on path 5 in equipment 1, and during this transportation, the parts are mounted sequentially onto a plurality of blocks 31—forming single board 3—at a plurality of stages.

On board 3, overall particular recognition marks 101 and 102 are provided on diagonal points for recognizing the whole position of board 3. On each block 31, individual recognition marks 201 and 202 are provided on diagonal points for recognizing an individual block. The whole position of board 3 can be detected by shooting marks 101, 102 on board 3 with camera 15 for recognizing the position of the marks. The position of each block 31 can be detected individually by shooting marks 201, 202 on block 31 with the same camera 15.

Next, a control system of the part-mounting-equipment is described with reference to FIG. 5.

In FIG. 5, controller 20 represents a central processing unit (CPU) for various calculations and controlling each section described hereinafter. Image recognizer 21 recognizes a positional deviation of a part with part-recognition-camera 12, and recognizes the position of a recognition mark provided on a board with board-recognition-camera 15. This position recognition is stored in recognition-mark-position-memory 28. Motor controller 22 controls motor 23 on X-axis, motor 24 on Y-axis both for moving the transfer head 10 horizontally, motor 25 on Z-axis for lifting and lowering the head 10, and motor 26 on θ axis for rotating head 10.

Coordinates memory 27 stores the coordinates data of a part mounting position on board 3. Recognition-mark-position-memory 28 stores (a) position data of overall recognition marks 101, 102 shot and recognized by camera 15, (b) position data of individual recognition marks 201, 202 shot and recognized by camera 15, and (c) relative positional data between these data described in (a) and (b). Recognition-practice-data-memory 29 stores recognition-practice-data of overall recognition marks 101, 102, and individual recognition marks 201, 202, i.e., types of recognition marks shot and recognized at each stage. The recognition practice data have been produced per each type of board 3, and input into memory 29. Program memory 30 stores various programs necessary for controlling mounting practices and processing calculations discussed above.

A mounting method of the equipment discussed above is demonstrated hereinafter with reference to FIG. 6.

FIG. 6A–FIG. 6D illustrate the sequence of performances at mounting stages 71, 72, 73 and 74 on upstream side of equipment 1 shown in FIG. 2.

Figure 6A:
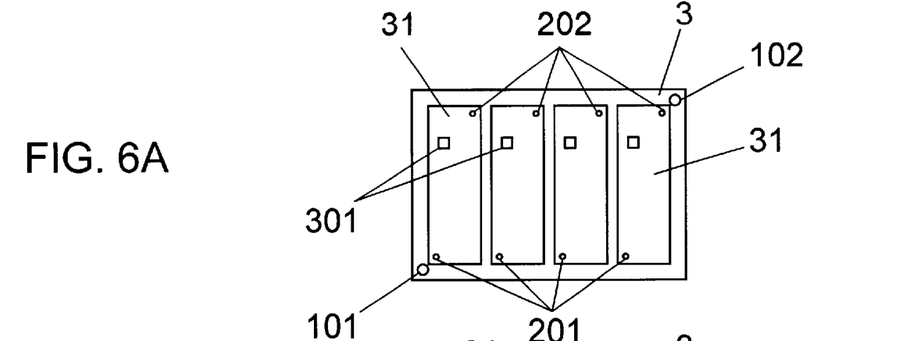
FIG. 6A–FIG. 6D illustrate processes of part-mounting-method in accordance with a first exemplary embodiment of the present invention.

First, as shown in FIG. 6A, at first mounting stage 71, board 3's position is recognized, where all the recognition points are recognized based on the recognition-practice-data stored in memory 29. All the recognition points include overall recognition marks 101, 102 formed diagonally on board 3 and individual recognition marks 201, 202 formed on respective blocks 31. In other words, in the first embodiment, recognition practice data is set so that all the recognition marks should be recognized at the first mounting stage.

The relative positions of individual recognition marks 201, 202 of each block 31 with respect to overall recognition marks 101, 102 of board 3 are thus recognized. Recognition-mark-position-memory 28 stores the result of this recognition. At first mounting stage 71, positional deviations of each block 31 are detected based on the recognition result. This result is reflected to a mounting practice such that a position of head 10 picking up part 301 is controlled so that parts 301 are mounted onto mounting points of blocks 31 correcting the positional deviation.

Figure 6B:
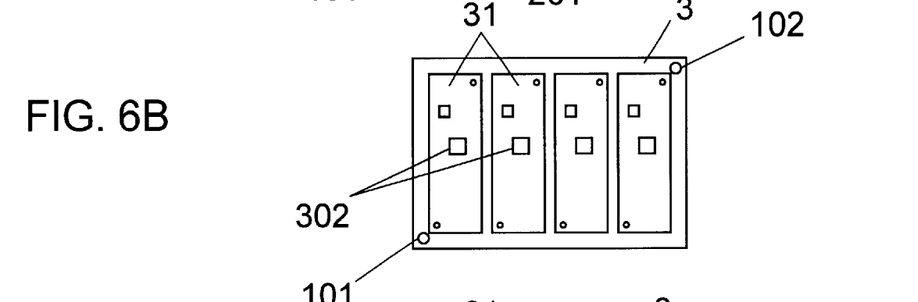

At the second mounting stage 72, as shown in FIG. 6B, parts 302 are mounted onto respective blocks 31. At stage 72, the recognition practice recognizes only overall recognition marks 101, 102 of board 3. Based on the whole position of board 3 recognized at this second stage 72 and the relative positional data stored in memory 28 at first stage 71, the positional deviation of respective blocks 31 are detected. In the same manner as discussed above, head 10 mounts parts 302 onto mounting points of respective blocks 31 correcting this positional deviation.

Figure 6C:
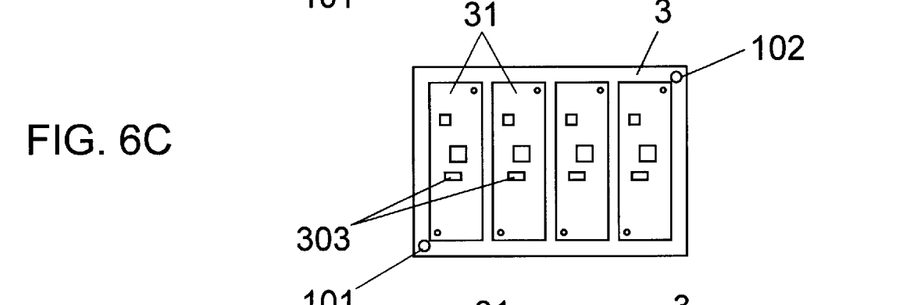
Figure 6D:
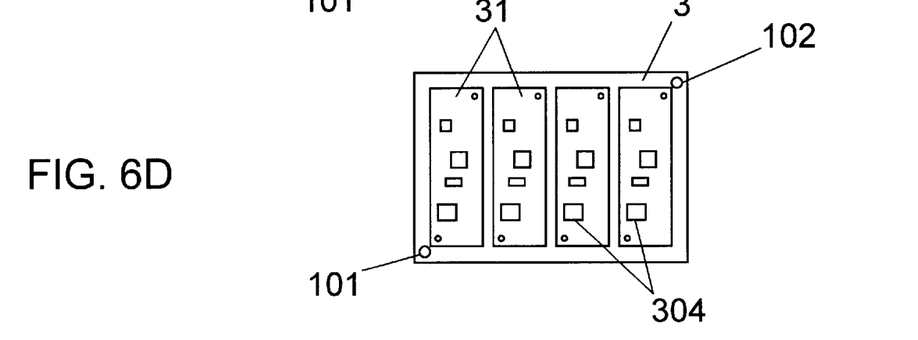

At the following stages 73, 74 and onward, the same process is carried out, i.e., at each stage, only overall recognition marks 101, 102 are recognized. Based on the whole position of board 3 obtained by this recognition and the relative positional data already recognized and stored, positional deviations of respective blocks 31 are detected. Then head 10 mounts parts 303, 304 and onward to respective mounting points of each block 31.

As such, in this first embodiment, all the recognition marks on board 3 are recognized at the first mounting stage, and the relative positional data of the individual recognition marks formed in board 3 are obtained. Thus at the second mounting stage and onward, only overall recognition marks 101, 102 are recognized, thereby detecting the positional deviations of respective blocks 31. Therefore, according to the first embodiment, a conventional method, i.e., the same recognition points are repeatedly recognized at each stage, can be avoided, and a total position recognition time can be shortened.

Second Exemplary Embodiment

FIG. 7A–FIG. 7D illustrate processes of part-mounting-method in accordance with the second exemplary embodiment of the present invention. In the first embodiment discussed above, recognizing all the recognition points was demonstrated as an example at the first mounting stage. In this second embodiment, the recognition practice data is set differently from the example of the first embodiment. For instance, numbers of board blocks are formed on board 3, and if all the recognition points are recognized at the first stage, it would be an excessive recognition load to one stage. The second embodiment is useful for such a case.

In the second embodiment, recognition practice data is set such that recognition practices are dispersed into a plurality of mounting stages in order to avoid producing intensive recognition load. This is detailed with reference to FIG. 7A–FIG. 7D which describe sequential practices, as same as FIG. 6A–FIG. 6D, at mounting stage 71, 72, 73 and 74 on the upstream side of part-mounting-equipment 1.

Figure 7A:
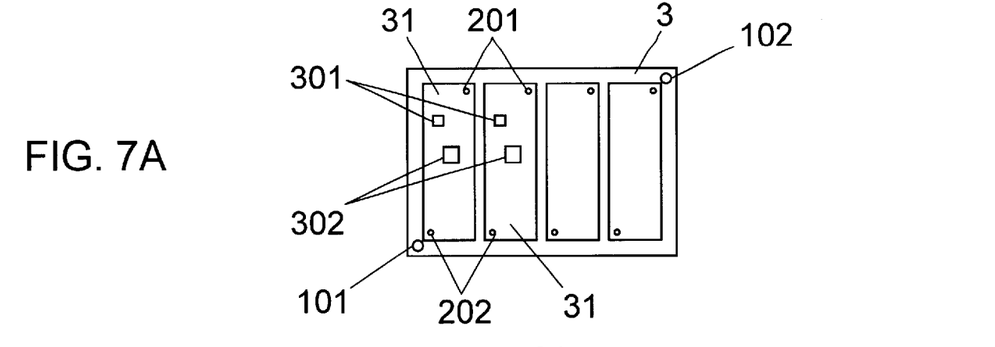
FIG. 7A–FIG. 7D illustrate processes of part-mounting-method in accordance with a second exemplary embodiment of the present invention.

First, as shown in FIG. 7A, a position of board 3 is recognized at first mounting stage 71. Based on the recognition practice data stored in recognition-practice-data-memory 29, overall recognition marks 101, 102 and individual recognition marks 201, 202 of two blocks 31 on the left side out of four blocks 31 are recognized. In other words, at specific stages, namely, at the first mounting stage 71 and the second mounting stage 72 downstream from the first stage 71, only two blocks 31 on the left side and target for part-mounting—are recognized.

Relative position of individual recognition marks 201, 202 of blocks 31 on the left side with respect to overall recognition marks 101, 102 of board 3 is then recognized. This recognition result is stored in recognition mark position memory 28. At first mounting stage 71, positional deviation of each block 31 is detected based on the recognition result. During a mounting practice, head 10 picking up parts 301, 302 is controlled so that this positional deviation is corrected, and parts 301, 302 are mounted onto respective mounting points on two blocks 31 on the left side.

Figure 7B:
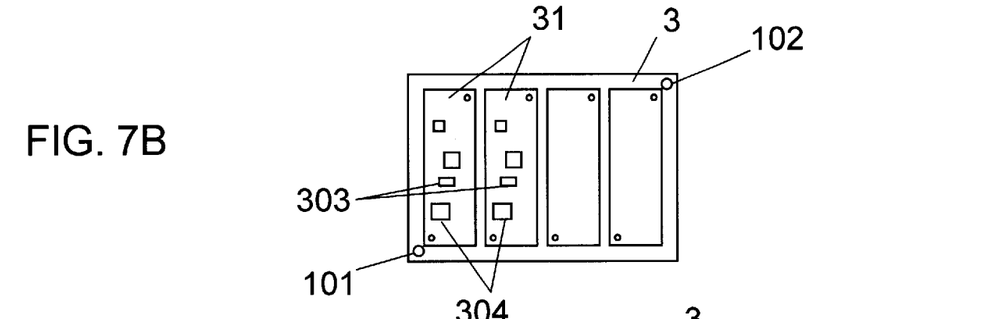

Then as shown in FIG. 7B, at second mounting stage 72, parts 303, 304 are mounted onto two blocks 31 on the left side. At second stage 72, only overall recognition marks 101, 102 are recognized. Positional deviation of block 31 is detected based on the whole position of board 3 obtained by this recognition and the relative positional data recognized and stored at the previous stage. Head 10 mounts parts 303, 304 onto mounting points of respective blocks 31 on the left side correcting this positional deviation.

Figure 7C:
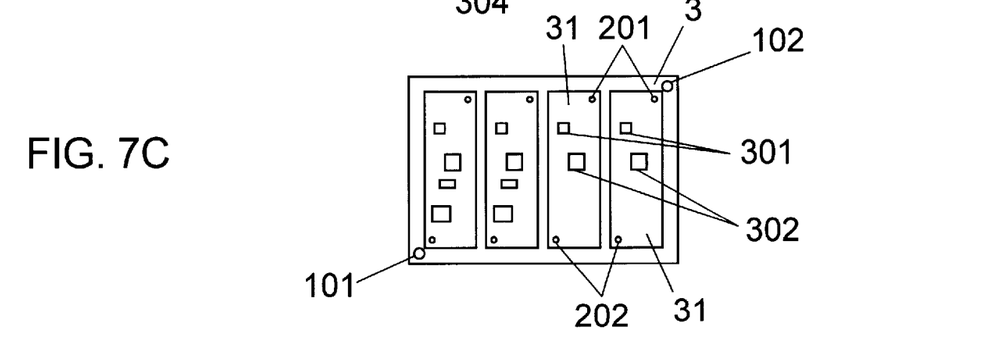

Next, recognition practice is carried out at third mounting stage 73, where overall recognition marks 101, 102 and individual recognition marks 201, 202 on two blocks 31 on the right side out of four blocks 31 are recognized. In other words, at specific stages, namely, at the third mounting stage 73 and the fourth mounting stage 74 downstream from the third stage 73, only two blocks 31—on the right side and target for part-mounting—are recognized.

Relative position of individual recognition marks 201, 202 of blocks 31 on the right side with respect to overall recognition marks 101, 102 of board 3 is then recognized. This recognition result is stored in recognition mark position memory 28. At third mounting stage 73, positional deviation 31 is detected based on the recognition result. During a mounting practice, head 10 picking up parts 301, 302 is controlled so that this positional deviation is corrected, and parts 301, 302 are mounted onto respective mounting points on two blocks 31 on the right side.

Figure 7D:
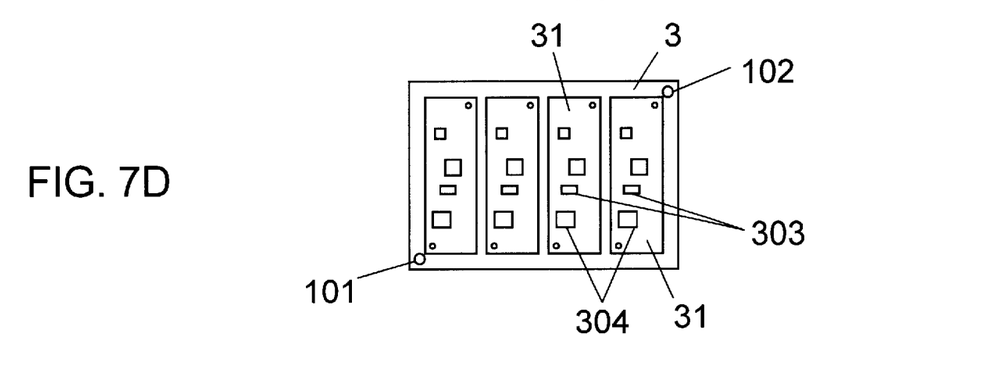

Then as shown in FIG. 7D, at fourth mounting stage 74, parts 303, 304 are mounted onto two blocks 31 on the right side. At fourth stage 74, only overall recognition marks 101, 102 are recognized. Positional deviation of block 31 is detected based on the whole position of board 3 obtained by this recognition and the relative positional data stored. Head 10 mounts parts 303, 304 onto mounting points of respective blocks 31 on the right side correcting this positional deviation.

In this second embodiment, first, a mounting stage, where block 31 is recognized, is determined. During the mounting practice, only overall recognition marks for positioning the whole position of board 3 and the recognition points of target blocks 31 of this particular stage as well as at a given stage downstream from this particular stage are recognized. Thus the relative positional data of respective recognition points with respect to the overall recognition points are obtained.

At the given stage downstream from the particular stage, the whole position of the board is detected by recognizing only the overall recognition marks. This is the same process as described in the first embodiment. Then based on this whole position and the relative positional data, positional deviation of target block 31 to the particular mounting stage is detected. During the mounting practice, this deviation is corrected before mounting the part onto the mounting position.

The second embodiment proves that repeatedly recognizing the same recognition points at respective stages can be avoided, so that a total recognition time can be shortened. Further, according to the method used in this second embodiment, intensive recognition load to one stage can be prevented by dispersing the load, so that the mounting practices can be balanced in the mounting line.

In the first and second embodiments discussed above, overall recognition marks 101, 102 are used as a particular recognition points for positioning the whole board. Recognition marks 101, 102 are independently provided on the fringe of blocks. However, instead of providing overall recognition marks 101, 102, individual recognition marks 201, 202 can be used as particular recognition points. In this case, marks 201, 202 are provided at specific positions, e.g., provided diagonally of a block. Further, instead of providing individual recognition marks 201, 202 exclusive for position recognition, some featuring sections formed at given places on respective blocks 31, such as electrodes, can be recognized for detecting the position.

When a board including a plurality of board blocks (unit boards) undergoes sequential part-mountings at a plurality of mounting stages, particular recognition points and recognition points of target blocks of a given mounting stage on downstream side are recognized at a mounting stage on the upstream side. Thus relative positional data of respective recognition points in the blocks with respect to the particular recognition points can be obtained. At the mounting stage on the downstream side, only the particular recognition points are recognized for detecting the whole position of the board. A positional deviation of a block at a mounting stage is detected based on the whole position and the relative positional data, so that repeated recognition of the same recognition points is avoided thereby shortening a total time of position recognition.

What is claimed is:

1. A method of mounting parts to a plurality of board blocks on a board at a plurality of mounting stages, said method comprising the steps of:
    (a) obtaining relative positional data for the board by recognizing recognition points of the board and recognition points of the plurality of board blocks at a first mounting stage;
    (b) detecting a whole position of the board by recognizing said recognition points of the board at a second mounting stage and a following stage;
    (c) detecting a positional deviation of the board blocks at the second mounting stage and the following mounting stage based on the whole position of the board and the relative positional data; and
    (d) mounting the parts to the board blocks based on the positional deviation.

2. The method as defined in claim 1, wherein in step (d), each one of the parts picked up by a transfer head is recognized and a positional deviation of the part is detected, then the deviation is corrected based on a detection result.

3. The method as defined in claim 1, wherein the particular recognition point is provided diagonally on the board.

4. The method as defined in claim 1, wherein the recognition points of the board blocks are provided diagonally on respective board blocks.

5. A method of mounting parts to a plurality of board blocks on a board at a plurality of mounting stages, said method comprising the steps of:
    (a) obtaining relative positional data for the board by recognizing, at one of said mounting stages, recognition points of the board and recognition points of the plurality of board blocks associated with said one of said mounting stages;
    (b) detecting a whole position of the board by recognizing said recognition points of the board downstream from said one of said mounting stages;
    (c) detecting a positional deviation of the board blocks downstream from said one of said mounting stages based on the whole position of the board and the relative positional data; and
    (d) mounting the parts to the board blocks based on the positional deviation.

6. The method as defined in claim 5, wherein in step (d), each one of the parts picked up by a transfer head is recognized and a positional deviation of the part is detected, and the deviation is corrected based on a detection result.

7. The method as defined in claim 5, wherein the particular recognition point is provided diagonally on the board.

8. The method as defined in claim 5, wherein the recognition points of the board blocks are provided diagonally on respective board blocks.

* * * * *